US011785708B1

(12) United States Patent
Takeda et al.

(10) Patent No.: US 11,785,708 B1
(45) Date of Patent: Oct. 10, 2023

(54) SENSOR DEVICE FOR MEASURING CURRENT IN ELECTRICAL CIRCUIT

(71) Applicant: Keysight Technologies, Inc., Santa Rosa, CA (US)

(72) Inventors: Ryo Takeda, Tokyo (JP); Bernhard Holzinger, Baden Wuerttemberg (DE)

(73) Assignee: KEYSIGHT TECHNOLOGIES, INC., Santa Rosa, CA (US)

(*) Notice: Subject to any disclaimer, the term of this patent is extended or adjusted under 35 U.S.C. 154(b) by 374 days.

(21) Appl. No.: 17/215,300

(22) Filed: Mar. 29, 2021

Related U.S. Application Data (60) Provisional application No. 63/030,546, filed on May 27, 2020.

(51) Int. Cl.
| | |
|---|---|
| *H01R 24/50* | (2011.01) |
| *H05K 1/02* | (2006.01) |
| *H05K 1/18* | (2006.01) |
| *G01R 19/00* | (2006.01) |
| *H01R 103/00* | (2006.01) |

(52) U.S. Cl.
CPC ....... *H05K 1/0224* (2013.01); *G01R 19/0092* (2013.01); *H01R 24/50* (2013.01); *H05K 1/181* (2013.01); *H01R 2103/00* (2013.01); *H05K 2201/09081* (2013.01); *H05K 2201/09354* (2013.01); *H05K 2201/10022* (2013.01); *H05K 2201/10189* (2013.01); *H05K 2201/10454* (2013.01); *H05K 2201/10522* (2013.01)

(58) Field of Classification Search
CPC ..... G01R 19/0092; H05K 2201/09081; H05K 2201/09354; H05K 2201/10022; H05K 2201/10189
See application file for complete search history.

(56) References Cited

U.S. PATENT DOCUMENTS

| | | | | |
|---|---|---|---|---|
| 5,823,790 A | * | 10/1998 | Magnuson | H01R 24/50 333/260 |
| 6,639,154 B1 | * | 10/2003 | Cartier | H05K 1/0222 174/262 |
| 2019/0187175 A1 | | 6/2019 | Brush, IV et al. | |

OTHER PUBLICATIONS

Andrew John Lucas Joannou, "A Study of Switching Transients of Gallium-Nitride Power Field Effect Transistors in a Defined Electromagnetic Environment", University of Johannesburg, Nov. 2015, pp. 1-178.

(Continued)

*Primary Examiner* — Dominic E Hawkins (57) ABSTRACT

A sensor device is provided for measuring current in an electrical circuit of a PCB, including a coaxial connector mounted on a tab in the PCB having an inner conductor and a concentric outer conductor, where the tab is formed by a gap through the PCB along a portion of a perimeter surrounding the coaxial connector; a sidewall conductor formed on sidewalls of the tab and connected to ground plane; and resistors mounted on the PCB and arranged along the portion of the perimeter surrounding the coaxial connector, each resistor being connected between the inner conductor and the sidewall conductor. Current from the electrical circuit flows in a first direction through the ground plane creating a first magnetic field, and flows in a second direction between the sidewall conductor and the inner conductor through the resistors creating a second magnetic field, where the first and second magnetic field partially cancel.

20 Claims, 4 Drawing Sheets

(56) References Cited

OTHER PUBLICATIONS

Sebastian Sprunck et al., "Transient Current Sensors for Wide Band Gap Semiconductor Switching Loss Measurements", PCIM Europe 2019, May 7-9, 2019, Nuremberg, Germany, pp. 2017-2024.
Věra Nováková Zachovalová et al., "New generation of cage-type current shunts developed using model analysis", Acta Imeko, Sep. 2015, vol. 4, No. 3, pp. 59-64.

* cited by examiner

SENSOR DEVICE FOR MEASURING CURRENT IN ELECTRICAL CIRCUIT

CROSS-REFERENCE TO RELATED APPLICATION

The present application claims priority under 35 U.S.C. § 119(e) and under 37 C.F.R. § 1.78(a) to commonly owned U.S. Provisional Application No. 63/030,546 filed on May 27, 2020. The entire disclosure of U.S. Provisional Application No. 63/030,546 is specifically incorporated herein by reference in its entirety.

BACKGROUND

Wide bandgap (WBG) power semiconductor devices are employed to power electronic circuits, aiming at improving efficiency and reducing size of an end product, such as an inverter for an electric vehicle, for example. Gallium Nitride (GaN) power semiconductor devices, in particular, operate at significantly faster switching speeds than power semiconductor devices made from other materials, such as silicon (Si) or silicon carbide (SiC). For example, switching transition time is typically more than 50 ns for Si power semiconductor devices and more than 10 ns for SiC power semiconductor devices. In comparison, switching transition time for GaN power semiconductor devices is less than 10 ns (down to 2 ns). The fast switching speed of GaN power semiconductor devices makes it difficult to measure current using conventional current measuring devices.

Generally, for accurate switching current measurement, both high bandwidth and low parasitic inductance, including insertion inductance, is needed. Conventional current sensors do not meet these criteria, in that current sensors with low parasitic inductance, tend to have low bandwidths, while current sensors with high bandwidths have large parasitic inductances. For example, a conventional coaxial shunt resistor current sensor provides a high bandwidth (e.g., ~50 MHz to 400 MHz), but the parasitic inductance is also high (e.g., over about 10 nH). Also, performance of coaxial shunt resistor current sensors may vary significantly depending on manufacturing quality, and the bandwidths may actually be less than claimed by the manufacturer. A conventional Pearson probe offers low parasitic inductance, but the bandwidth is also low (e.g., ~60 MHz). A convectional Rogowski coil probe likewise provides low parasitic inductance, but again the bandwidth is low (e.g., ~30 MHz). Also, variations caused by the position and angle of conventional current sensors directly impact measurement accuracy. Therefore, consistent and accurate current measurements on fast switching devices, such as GaN power semiconductor devices, are not possible today.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

Unless otherwise noted, when a first element is said to be connected to a second element, this encompasses cases where one or more intermediate elements may be employed to connect the two elements to each other. However, when a first element is said to be directly connected to a second element, this encompasses only cases where the two elements are connected to each other without any intermediate or intervening devices. Similarly, when a signal is said to be coupled to an element, this encompasses cases where one or more intermediate elements may be employed to couple the signal to the element. However, when a signal is said to be directly coupled to an element, this encompasses only cases where the signal is directly coupled to the element without any intermediate or intervening devices.

As used in the specification and appended claims, the terms "a," "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top" and "bottom," may be used to describe the various elements' relationships to one another, as illustrated in the accompanying drawings. These relative terms are intended to encompass different orientations of the elements thereof in addition to the orientation depicted in the drawings. For example, if an apparatus (e.g., a current sensor device) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

According to various embodiments, a current sensor device is provided for use with an oscilloscope, the sensor device having high bandwidth and low parasitic inductance. For example, the sensor device may have a high bandwidth greater than about 300 MHz and a low parasitic inductance less than about 1 nH, allowing clean current waveform measurement with less roll of and less ringing. The sensor device measures current in an electrical circuit or device under test (DUT) of a printed circuit board (PCB), meaning that the electrical circuit is formed of components on and/or in the PCB.

According to a representative embodiment, a sensor device is provided for measuring current in an electrical circuit of a PCB. The sensor device includes a coaxial connector mounted on a tab in the PCB and having an inner conductor and a concentric outer conductor, where the tab is formed by a gap through the PCB along a portion of a perimeter surrounding the coaxial connector; bottom plating formed on a bottom surface of the tab and connected to ground; sidewall plating formed on sidewalls of the tab and connected to the bottom plating, the sidewalls being defined by the gap through the PCB; multiple resistors mounted on the tab and arranged along the portion of the perimeter surrounding the coaxial connector, each resistor being connected between the inner conductor of the coaxial connector and the side plating; and a conductive cover mounted on the tab and arranged over the resistors, the conductive cover being connected between the concentric outer conductor of the coaxial connector and the side plating, where the concentric outer conductor of the coaxial connector is connected to the bottom plating through a via connection in the tab. Current from the electrical circuit flows in a first direction between the bottom plating and the sidewall plating creating a first magnetic field, flows in a second direction between the sidewall plating and the inner conductor of the coaxial connector through the plurality of resistors creating a second magnetic field, and further flows in the first direction between the concentric outer conductor of the coaxial connector and the sidewall plating creating a third magnetic field, where the first and third magnetic fields substantially cancel the second magnetic field.

Figure 1A:
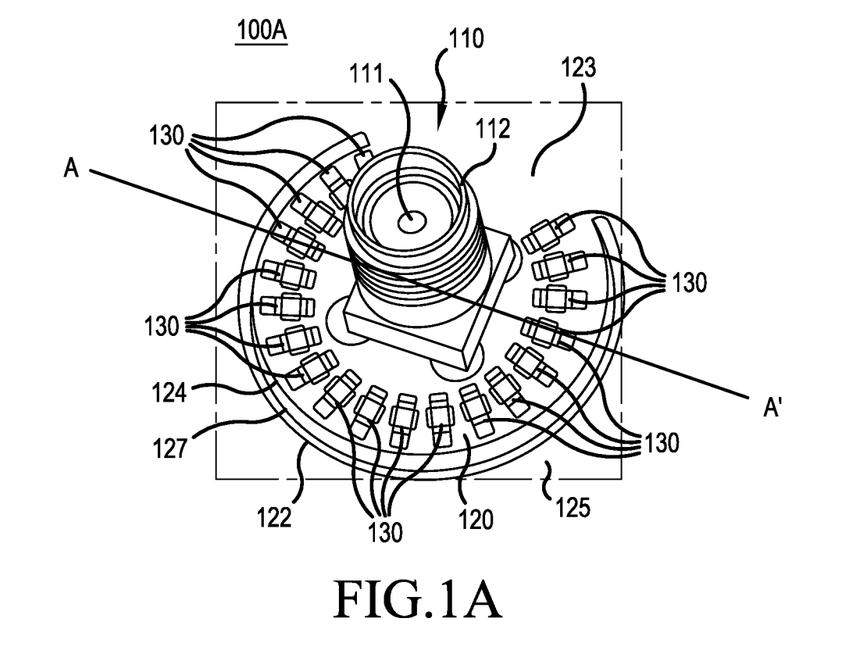
FIG. 1A is a top perspective view of a sensor device for measuring current in an electrical circuit of a PCB, according to a representative embodiment.
Figure 1B:
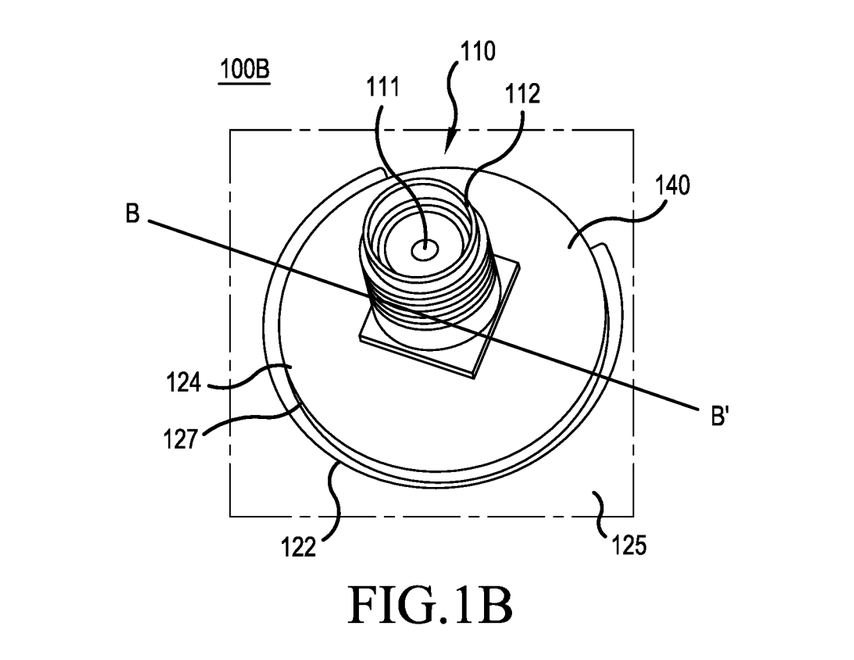
FIG. 1B is a top perspective view of a sensor device, including a conductive cover, for measuring current in an electrical circuit of a PCB, according to a representative embodiment.

FIG. 1A is a top perspective view of a sensor device for measuring current in an electrical circuit of a PCB, according to a representative embodiment, and FIG. 1B is a top perspective view of a sensor device, including a conductive cover, for measuring current in an electrical circuit of a PCB, according to a representative embodiment.

Referring FIG. 1A, a sensor device 100A includes a coaxial connector 110 mounted on a tab 120 formed in a PCB 125, where the coaxial connector 110 includes an inner conductor 111 and a concentric outer conductor 112. The coaxial connector 110 may be soldered to contacts on the tab 120 on a top surface of the PCB 125, for example. The PCB 125 includes the electrical circuit (not shown) being measured by the sensor device 100A, where the electrical circuit has components on and/or in the PCB 125, which also includes the sensor device 100A. The electrical circuit of the PCB 125 may be a fast switching speed power semiconductor device, such as a GaN power semiconductor device including a GaN field effect transistor (FET), for example, or other WBG power semiconductor device.

In the depicted configuration, the coaxial connector 110 is a female connector where the inner conductor 111 includes a hole contact for accepting a pin from a male coaxial connector counterpart, and the concentric outer conductor 112 includes threading on an outer surface to accommodate a screw fitting with the male coaxial connector counterpart. However, in an alternative configuration, the coaxial connector may be a male connector, without departing from the scope of the present teachings. Also, the coaxial connector 110 may be implemented by any other type of compatible connector, such as s subminiature version A (SMA) connector, a micro coaxial connector (MCX) connector, a microminiature coaxial (MMCX) connector, or custom coaxial or non-coaxial connector, for example, without departing from the scope of the present teachings.

The coaxial connector 110 may be connected to a measurement instrument (not shown), such as an oscilloscope, for example, through a coaxial cable (not shown), effectively acting as an interface to the sensor device 100A. The measurement instrument is configured to measure a voltage signal from the sensor device 100A, and to calculate a corresponding current through the electrical circuit, as would be apparent to one skilled in the art. Generally, the oscilloscope is able to determine the current from the electrical circuit by measuring a voltage drop over resistors 130, discussed below. The measurement instrument may be configured to perform any of various tests to characterize the electrical circuit, such as a well known double pulse test to measure switching characteristics of the electrical circuit. Such measurements are performed internally to the PCB 125, as opposed to conventional current measurement methods that depend on external components connected to the PCB 125. For example, conventional current measurement techniques may require attaching a commercial shunt resistor by making electrical port for the coaxial shunt resistor or soldering non-coaxial chip type resistor on the PCB.

In the depicted embodiment, the tab 120 is a part of the PCB 125 that is partially separated from the surrounding portions of the PCB 125 by a gap 122 formed through the PCB 125 along a portion of a perimeter surrounding the coaxial connector 110. In the depicted embodiment, the perimeter surrounding the coaxial connector 110 is substantially circular, and the thus the portion of the perimeter along which the gap 122 is formed is a portion of a circumference of a circle. Alternatively, the perimeter surrounding the coaxial connector 110 may be substantially square, rectangular, triangular, trapezoidal, or any other shape, with the gap 122 formed along a portion of the same, without departing from the scope of the present teachings. Since the gap 122 is formed only along the portion of the perimeter, the tab 120 remains attached to the PCB 125 by a bridge 123, through which conductors electrically connect the sensor device 100A to the electrical circuit being measured.

The gap 122 defines a sidewall 124 of the tab 120, such that the gap 122 extends between the sidewall 124 of the tab 120 and a corresponding sidewall 126 of the PCB 125. The sensor device 100A further includes a sidewall conductor 127 formed on the sidewalls 124 of the tab 120. The sidewall conductor 127 is connected to a ground plane (not shown) of the PCB 125. The sidewall conductor 127 may be metallic plating applied to the sidewall 124 (sidewall plating). The sidewall plating may be formed of gold, copper, nickel, silver or aluminum, or combinations thereof, for example, although any electrically conductive material capable of being plated on the sidewall 124 may be incorporated, without departing from the scope of the present teachings.

The sensor device 100A also includes multiple resistors 130 mounted on the tab 120 of the PCB 125, where the resistors 130 are arranged along the portion of the perimeter along which the gap 122 is formed, partially surrounding the coaxial connector 110. In other words, the resistors are arranged along the inside of the gap 122, between the gap 122 and the coaxial connector 110. In the depicted example, since the perimeter is substantially circular, the resistors 130 are arranged radially around the coaxial connector 110. Each of the resistors 130 has an inner terminal connected to the inner conductor 111 of the coaxial connector 110, e.g., through an internal conductor in the tab 120 of the PCB 125, discussed below, and an outer terminal connected to the ground plane of the PCB 125 through the sidewall conductor 127. In the depicted embodiment, the resistors 130 are surface mounted resistors, such as chip resistors, on the top surface of the PCB 125 on the tab 120, although other types of resistors may be incorporated without departing from the scope of the present teachings. There are 20 resistors 130 shown for purposes of illustration, each of which has the same resistance value, although the number of resistors and their values may vary to provide unique benefits for any particular situation or to meet application specific design requirements of various implementations, as would be apparent to one skilled in the art. So for example, when the 20 resistors 130 are 2Ω resistors, the final resistance of the sensor device 100A is 100 mΩ (2Ω/20=0.1Ω). Of course, the final resistance may be changed by changing the resistance value of the resistors 130.

Figure 2A:
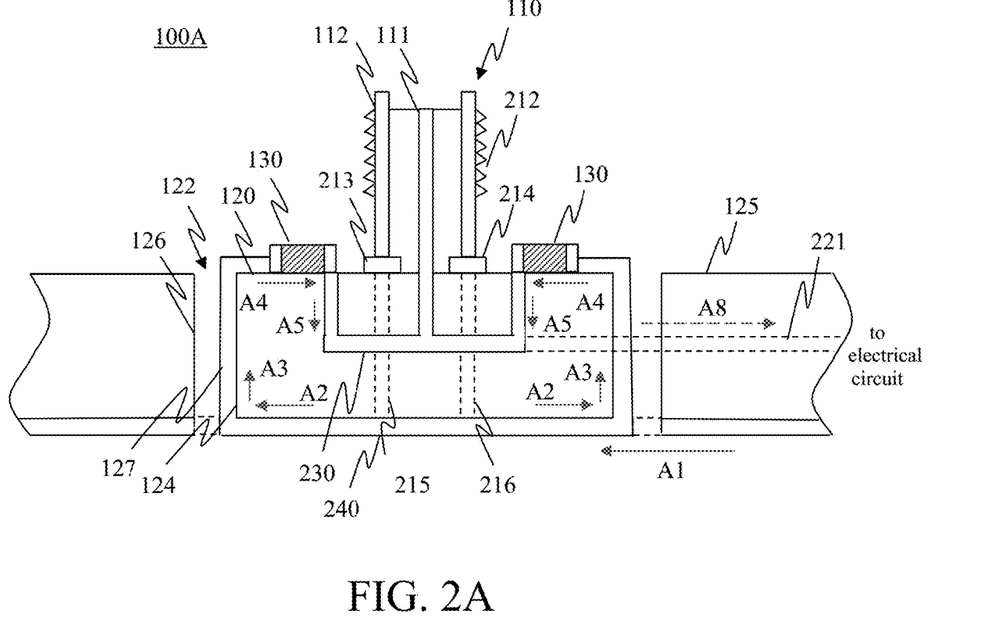
FIG. 2A is a simplified cross-sectional view of a sensor device for measuring current in an electrical circuit of a PCB, according to a representative embodiment.
Figure 3:
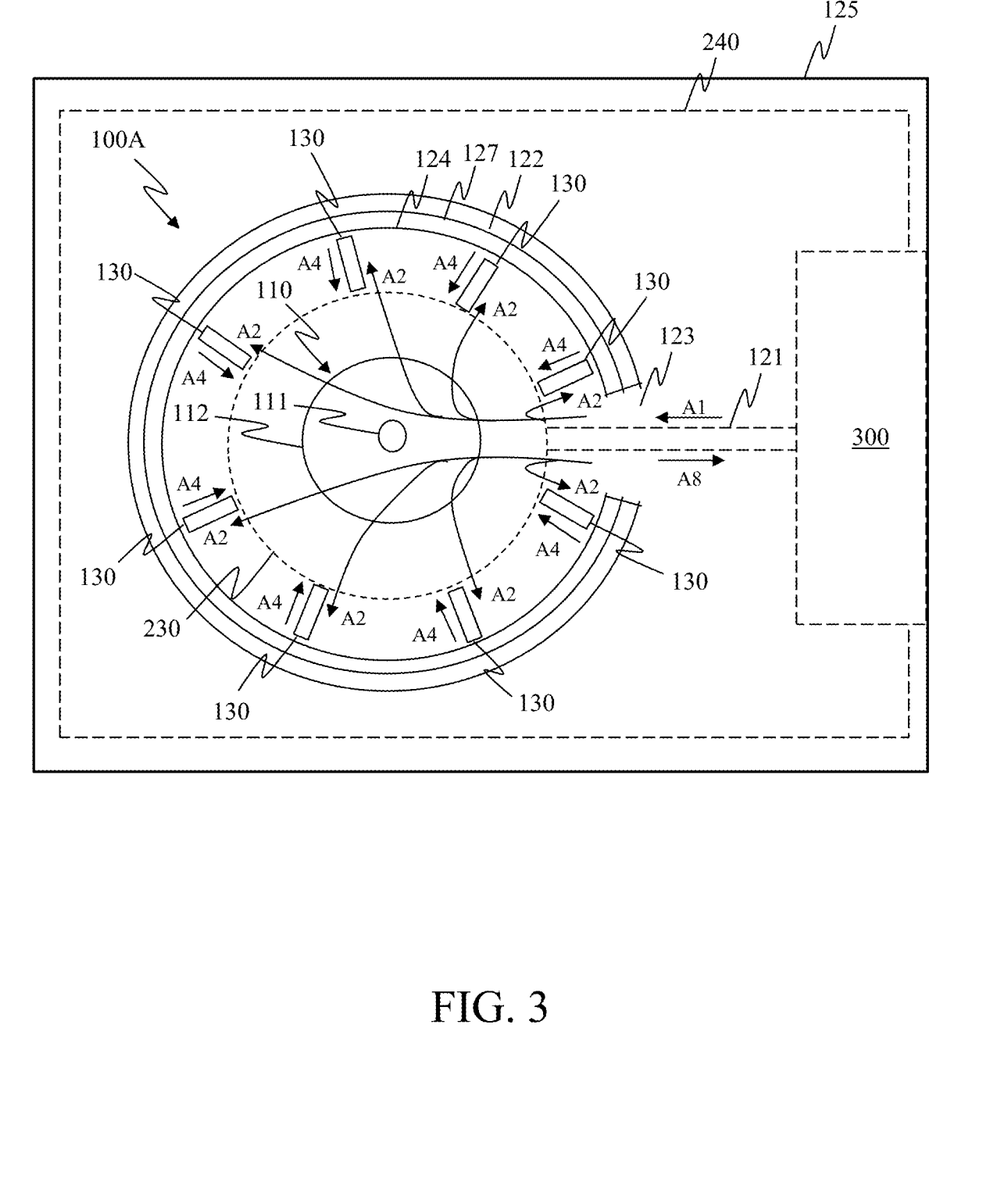
FIG. 3 is a simplified top plan view of a sensor device for measuring current in an electrical circuit of a PCB, according to a representative embodiment.

Generally, in the depicted configuration, current from the electrical circuit flows through the ground plane of the PCB 125 in a first direction creating a first magnetic field generally below the resistors 130, and flows through the resistors 130 in a second direction creating a second magnetic field. The first and second magnetic fields likewise are induced in opposite directions, and therefore at least a portion of each of the first and second magnetic fields cancel out. For example, as shown in FIGS. 2A and 3, the current may flow from the electrical circuit through the ground plane of the PCB 125 and outward toward the sidewall conductor 127 in the first direction creating the first magnetic field, then from the sidewall conductor 127 through the resistors 130 to the inner conductor 111 of the coaxial connector 110 in the second direction, and from the inner conductor 111 back to the electrical circuit. Of course, alternatively, the current may flow from the electrical circuit to the inner conductor 111 of the coaxial connector 110 and outward from the inner conductor 111 to the sidewall conductor 127 through the resistors 130 in the second direction creating the second magnetic field, and then from the sidewall conductor 127 inward through the ground plane of the PCB 125 in the first direction creating the first magnetic field, and then back to the electrical circuit through the ground plane.

Referring FIG. 1B, a sensor device 100B is the same as the sensor device 100A, discussed above, with the addition of a conductive cover 140 arranged over the resistors 130. The conductive cover 140 includes an inner edge connected to the concentric outer conductor 112 of the coaxial connector 110 and an outer edge connected to the sidewall conductor 127, which in turn is connected to the ground plane of the PCB 125 and the resistors 130. The conductive cover 140 covers the top surface of the tab 120 from the coaxial connector 110 to the gap 122, with the coaxial connector 110 extending through the conductive cover 140. Although shown covering the entire top surface of the tab 120, it is understood that the conductive cover 140 may cover a portion of the top surface less than the entire top surface of the tab 120, as long as it covers the resistors 130. The conductive cover 140 also provides physical protection of the resistors 130, which are not exposed in the sensor device 100B, as they are in the sensor device 100A.

The conductive cover 140 provides an additional current path from the concentric outer conductor 112 of the coaxial connector 110 through the resistors 130, as discussed further below. Therefore, in the depicted configuration, the current from the electrical circuit further flows in the first direction between the concentric outer conductor 112 of the coaxial connector 110 and the sidewall conductor 127 through the conductive cover 140, creating a third magnetic field generally above the resistors 130. The third magnetic field therefore is induced in the same direction as the first magnetic field. Accordingly, the first and third magnetic fields together cancel at least a portion of the second magnetic field, where substantially all of the second magnetic field may be canceled. Since the conductive cover 140 provides a return path that is closer to the resistors 130 than the ground plane of the PCB 125, the enclosed area between the conductive cover 140 and the resistors is smaller, resulting in better cancelation of the second magnetic field and lower parasitic inductance, including insertion inductance. For example, in this case, the second magnetic field is substantially canceled such that the parasitic inductance may be less than about 1 nH.

As discussed above, the current may flow through the conductive cover 140 in either direction, depending on where the current from the electrical circuit enters the sensor device 100B. For example, when the current enters the sensor device 100B from the electrical circuit through the ground plane of the PCB 125, the current flows into the concentric outer conductor 112 of the coaxial connector 110 and through the conductive cover 140 toward the sidewall conductor 127 in the first direction creating the third magnetic field. When the current enters the sensor device 100B from the electrical circuit through the inner conductor 111 of the coaxial connector 110, the current flows through the resistors 130 to the sidewall conductor 127, and then through the conductive cover 140 toward the concentric outer conductor 112 in the first direction.

Figure 2B:
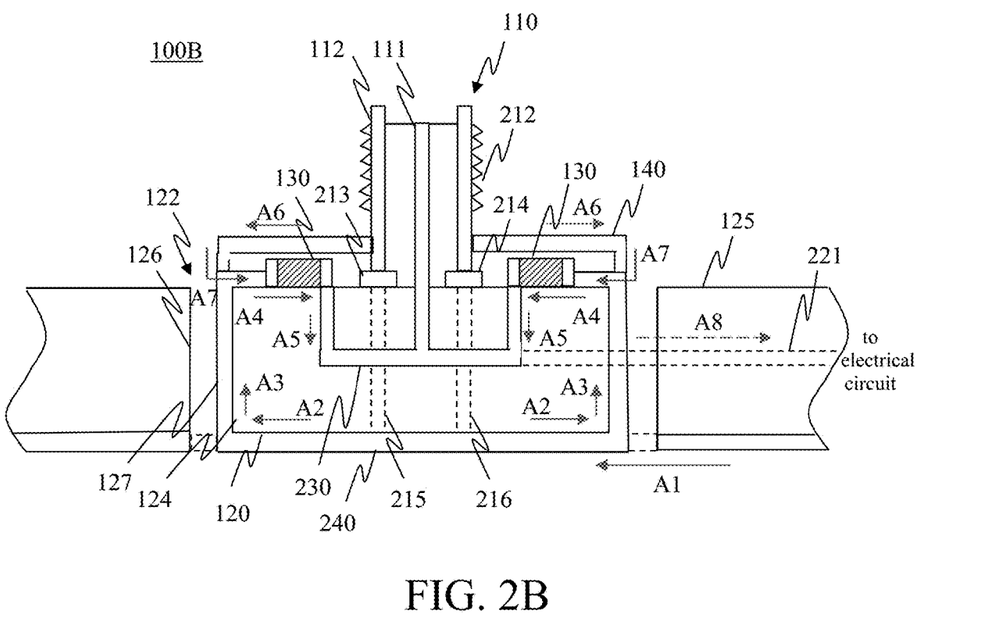
FIG. 2B is a simplified cross-sectional view of a sensor device, including a conductive cover, for measuring current in an electrical circuit of a PCB, according to a representative embodiment.

FIG. 2A is a simplified cross-sectional view of a sensor device for measuring current in an electrical circuit of a PCB, according to a representative embodiment, and FIG. 2B is a simplified cross-sectional view of a sensor device, including a conductive cover, for measuring current in an electrical circuit of a PCB, according to a representative embodiment. More particularly, FIG. 2A is a simplified cross-sectional view of the sensor device 100A along line A-A' in FIG. 1A, and FIG. 2B is a simplified cross-sectional view of the sensor device 100B along line B-B' in FIG. 1B.

Referring to FIG. 2A, the cross-section of the sensor device 100A includes the coaxial connector 110 mounted on the tab 120 formed in a PCB 125 by the gap 122. In the depicted embodiment, the coaxial connector 110 is a female coaxial connector that includes the inner conductor 111 and the concentric outer conductor 112, although the coaxial connector 110 may be a male connector, without departing from the scope of the present teachings. The coaxial connector 110 is connected to the top surface of the tab 120 by contacts 213 and 214, by soldering, for example. The concentric outer conductor 112 includes threading 212 on its outer surface to accommodate a screw fitting with the male coaxial connector counterpart (or with the female coaxial connector counterpart in the event the coaxial connector 110 is a male coaxial connector). The PCB 125 includes the electrical circuit (not shown) that provides the current that is being measured by the sensor device 100A. The coaxial connector 110 may be connected to a measurement instrument (not shown), such as an oscilloscope, for example, through a coaxial cable.

As discussed above, the tab 120 is partially separated from the surrounding portions of the PCB 125 by the gap 122 formed through the PCB 125 along a portion of a perimeter surrounding the coaxial connector 110. The tab 120 remains attached to the PCB 125 by the bridge 123 (not shown in FIG. 2A), through which a conductor 221 connects the sensor device 100A to the electrical circuit being measured. The conductor 221 is shown as a dashed line as it is not in the plane of the cross-section.

The gap 122 defines the sidewall 124 of the tab 120, such that the gap 122 extends between the sidewall 124 of the tab 120 and the corresponding sidewall 126 of the PCB 125. The sidewall conductor 127 is formed on the sidewall 124 of the tab 120, where the sidewall conductor 127 may be metallic plating applied to the sidewall 124 (sidewall plating). The sidewall conductor 127 is connected to ground plane 240 of the PCB 125, which in the depicted embodiment is implemented as metallic plating on a bottom surface of the PCB 125 (bottom plating), including the bottom surface of the tab 120. Alternatively, the ground plane 240 may be an internal conductive layer of the PCB 125, without departing from the scope of the present teachings. The sidewall plating forming the sidewall conductor 127 and the bottom plating forming the ground plane 240 may be gold, copper, nickel, silver or aluminum, or combinations thereof, for example, although any electrically conductive material capable of being plated may be incorporated, without departing from the scope of the present teachings.

The resistors 130 are shown mounted on the tab 120 of the PCB 125 between the coaxial connector 110 and the gap 122. Each of the resistors 130 has an inner terminal connected to the inner conductor 111 of the coaxial connector 110 through internal conductor 230 and an outer terminal connected to the ground plane 240 through the sidewall conductor 127. Also, the concentric outer conductor 112 of the coaxial connector 110 is connected to the ground plane 240 through via connections 215 and 216. The via connections 215 and 216 are shown as dashed lines as they are not in the plane of the cross-section. The outer conductor may be connected to the via connections through the contacts 213 and 214. In an alternative configuration of the sensor device 100A (as well as the sensor device 100B), the inner terminal of each of the resistors 130 may be connected to the concentric outer conductor 112 of the coaxial connector 110 and the outer terminal of each of the resistors 130 may be connected inner conductor 111 through an internal conductor, and the inner conductor 111 may be connected to the ground plane 240 through a via connection, without departing from the scope of the present teachings. Of course, this configuration would reverse the current paths, but otherwise would function in the manner described herein. Also, with regard to the sensor device 100B, in particular, this configuration would require the conductive cover 140 to be isolated from the concentric outer conductor 112.

In the depicted configuration, current flows from the electrical circuit through the ground plane 240 at the bridge 123, as indicated by arrow A1. The current then flows outwardly through the ground plane 240 toward the sidewall conductor 127 on the sidewall 124, as indicated by arrows A2, and up the sidewall conductor to the resistors 130, as indicated by arrows A3. In an alternative configuration, an input conductor is provided separate from the ground plane 240 for transmitting the current to the sensor device 100A from the electrical circuit. This separate input conductor may electrically connect to the ground plane 240 at approximately the center of the sensor device 100A, e.g., directly below the inner conductor 111. This configuration forces the current from the electrical circuit to flow into the ground plane 240 at a centralized location, so that the distance traveled by the current to the sidewall conductor 127 and then to each of the resistors 130 is substantially the same.

The current flows from the sidewall conductor 127 through the resistors 130, as indicated by arrows A4, to the inner conductor 111 of the coaxial connector 110 through the internal conductor 230, as indicated by arrows A5. The current returns to the electrical circuit through the conductor 221, as indicated by arrow A8. Of course, the current likewise flows through the other resistors 130 in the same direction (inwardly) as indicated by the arrows A4. Therefore, in the depicted configuration, the current flow indicated by arrows A2 through the ground plane 240 toward the sidewall conductor 127 is in a first direction, and the current flow indicated by arrows A4 through the resistors 130 toward the inner conductor 111 is in a second direction, which is opposite to the first direction. Accordingly, a first magnetic field induced below the resistors 130 by the current flow indicated by arrows A2 through the ground plane 240 and a second magnetic field induced at the resistors 130 by the current flow indicated by arrows A4 through the resistors 130 at least partially cancel one another. The at least partial canceling of the first and second magnetic fields reduces the parasitic inductance of the sensor device 100A.

Referring to FIG. 2B, the sensor device 100B is the same as the sensor device 100A, discussed above, with the addition of the conductive cover 140 arranged over the resistors 130. The conductive cover 140 includes an inner edge connected to the concentric outer conductor 112 of the coaxial connector 110 and an outer edge connected to the sidewall conductor 127, which in turn is connected to the ground plane 240 of the PCB 125. The conductive cover 140 covers the top surface of the tab 120 from the coaxial connector 110 to the gap 122, with the coaxial connector 110 extending through an opening in the conductive cover 140.

The conductive cover 140 provides an additional current path from the ground plane 240, through the concentric outer conductor 112 of the coaxial connector 110 and the resistors 130, to the inner conductor 111. In particular, in the depicted configuration, current flows from the electrical circuit through the ground plane 240 at the bridge 123, as indicated by arrow A1. In addition to flowing outwardly through the ground plane 240 and up the sidewall conductor 127 on the sidewall 124, as indicated by arrows A1 and A2, the current flows through the via connections 215 and 216 to the concentric outer conductor 112 of the coaxial connector 110. From there, the current flows through the conductive cover 140 to the sidewall conductor 127, as indicated by arrows A6, and to the resistors 130, as indicated by arrows A7. Then, the current flows through the resistors 130, as indicated by arrows A4, and the internal conductor 230, as indicated by arrows A5, to the inner conductor 111 of the coaxial connector 110. The current returns to the electrical circuit through the conductor 221, as indicated by arrow A8. Of course, the current likewise flows through the other resistors 130 in the same direction (inwardly) as indicated by the arrows A4.

Therefore, in the depicted configuration, the current flow indicated by arrows A6 through the conductive cover 140 is in the first direction, like the current flow indicated by arrows A2 through the ground plane 240 toward the sidewall conductor 127, and induces a third magnetic field above the resistors 130. The current flow indicated by arrows A4 through the resistors 130 toward the inner conductor 111 is in the second direction, which is opposite to the first direction, as discussed above. Accordingly, the first magnetic field induced by the current flow indicated by arrows A2 through the ground plane 240 and the third magnetic field induced by the current flow indicated by arrows A6 through the conductive cover 140 together at least partially cancel the second magnetic field induced by the current flow indicated by arrows A4 through the resistors 130. The at least partial canceling reduces the parasitic inductance of the sensor device 100B. Also, since the current return path provided by the conductive cover 140 is closer to the resistors 130 than the current return path provided by the ground plane 240, the cancelation of the second magnetic field induced by opposite current flow is greater with the conductive cover 140 than in the case of only the first magnetic field partially canceling the second magnetic field as in FIG. 2A.

In FIGS. 2A and 2B, it is assumed for purposes of illustration that the current from the electrical circuit flows into the sensor devices 100A and 100B through the ground plane 240, and returns to the electrical circuit through the conductor 221. Alternatively, the current from the electrical circuit may flow into the sensor devices 100A and 100B through the conductor 221, and return to the electrical circuit through the ground plane 240, without departing from the scope of the present teachings. In this case, the arrows A1-A8 would each point in the opposite direction, but the results of the first (and third) magnetic fields canceling at least a portion of the second magnetic field would be the same.

FIG. 3 is a simplified top plan view of a sensor device for measuring current in an electrical circuit of a PCB, according to a representative embodiment. More particularly, FIG. 3 is a top plan view of the sensor device 100A, and is intended to show an example of general current flow from and to electrical circuit 300 of the PCB 125 through the sensor device 100A.

Referring to FIG. 3, the PCB 125 includes the sensor device 100A and the electrical circuit 300 being measured by the sensor device 100A. The sensor device 100A includes the coaxial connector 110 mounted on the tab 120 formed in the PCB 125 by the gap 122. The tab 120 is partially separated from the surrounding portions of the PCB 125 by the gap 122 formed through the PCB 125 along a portion of a perimeter surrounding the coaxial connector 110. In the depicted embodiment, the perimeter surrounding the coaxial connector 110 is substantially circular, and the thus the portion of the perimeter along which the gap 122 is formed is a portion of a circumference of a circle. The tab 120 is attached to the PCB 125 by the bridge 123, through which includes circuitry through which current passes from and to the electrical circuit 300.

The gap 122 defines the sidewall 124 of the tab 120, and the sidewall conductor 127 is formed on the sidewall 124 of the tab 120, where the sidewall conductor 127 may be metallic plating applied to the sidewall 124. The sidewall conductor 127 is connected to ground plane 240 of the PCB 125, which in the depicted embodiment is on the bottom surface of the PCB 125, and therefore indicated by a dashed line. There are eight representative resistors 130 shown mounted on the tab 120 in a substantially radial fashion, since the tab 120 is essentially circular in shape. Each of the resistors 130 has an inner terminal connected to the inner conductor 111 of the coaxial connector 110 through the internal conductor 230 and an outer terminal connected to the sidewall conductor 127, which is connected to the ground plane 240. The inner conductor 111 is connected back to the electrical circuit 300 through the conductor 221.

As shown, current flows from the electrical circuit 300 through the ground plane 240 at the bridge 123 into the sensor device 100A, as indicated by arrow A1. From the ground plane 240, the current flows outwardly to the sidewall conductor 127 on the sidewall 124, as indicated by arrows A2, and up the sidewall conductor to the resistors 130. The current flows from the sidewall conductor 127 through each of the resistors 130, as indicated by arrows A4, to the inner conductor 111 of the coaxial connector 110 through the internal conductor 230. The current then returns to the electrical circuit 300 through the conductor 221, as indicated by arrow A8. Again, the current flows indicated by arrows A2 through the ground plane 240 to the sidewall conductor 127 is in a first direction, and the current flow indicated by arrows A4 through the resistors 130 toward the inner conductor 111 is in a second direction, which is opposite to the first direction. Accordingly, the first magnetic field induced by the current flow indicated by arrows A2 and the second magnetic field induced by the current flow indicated by arrows A4 at least partially cancel one another.

As stated above, the sensor device according to the various embodiments provides a high bandwidth (e.g., greater than about 300 MHz) and low parasitic induction (less than about 1 nH), which significantly improves current measurement over conventional current sensor offering either high bandwidth or low parasitic induction, but not both. The high bandwidth enables clean current waveform measurement and less roll off, and the low parasitic induction provides less ringing, for example.

Figure 4:
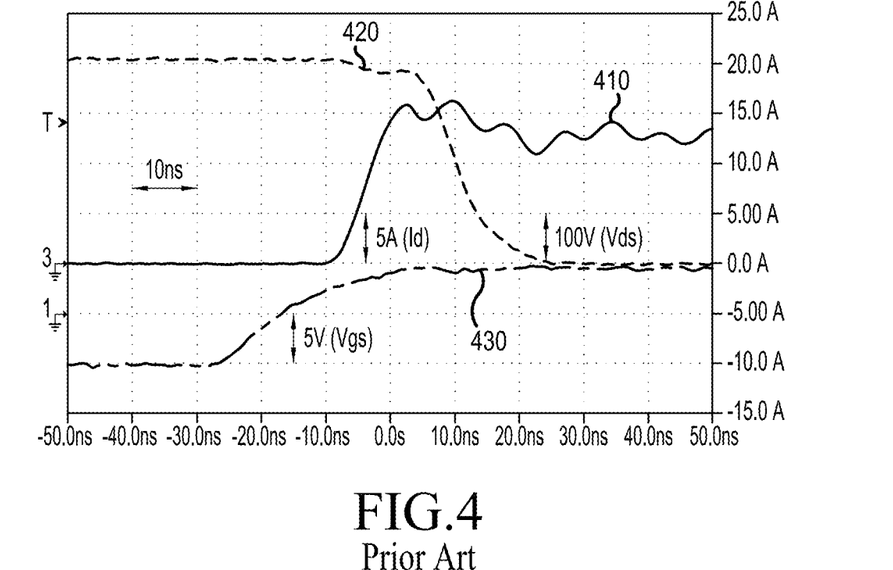
FIG. 4 is a graph showing measurement results using a conventional current sensor.
Figure 5:
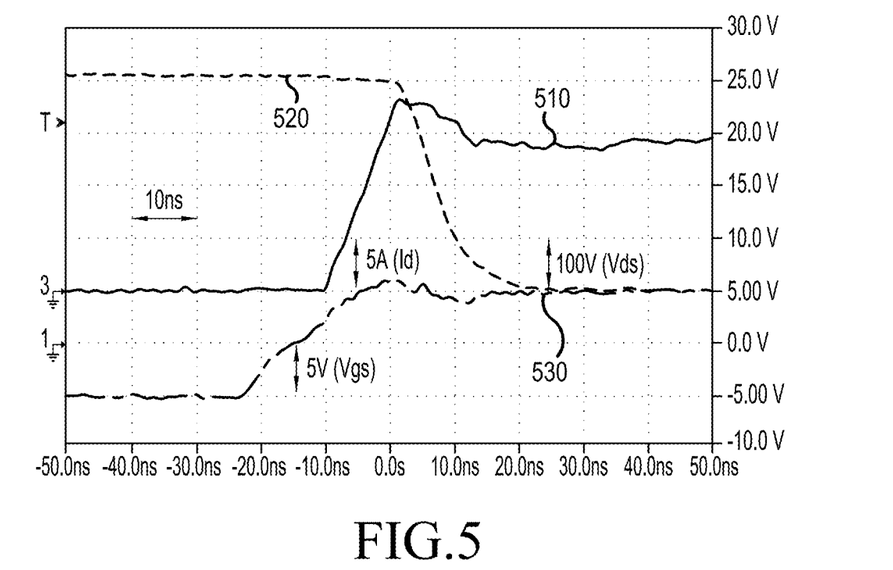
FIG. 5 is a graph showing measurement results using a current sensor, according to a representative embodiment.

FIG. 4 is a graph showing measurement results using a conventional current sensor, and FIG. 5 is a graph showing measurement results using a current sensor according to a representative embodiment, for purposes of comparison. The sensors were used to measure current in a GaN high-electron-mobility transistor (HEMT), which is an example of a fast switching power semiconductor device.

Referring to FIG. 4, the measurement results were obtained using a conventional Pearson probe with low parasitic inductance, but low bandwidth as well. That is, the Pearson probe is generally expected to have lower parasitic inductance because it uses only induced magnetic field to measure current. Trace 410 in FIG. 4 shows current Id (drain current) through the GaN HEMT, which includes a current ramp having an increase of about 15 A between about −10.0 ns and 0.0. The current ramp occurs when the GaN HEMT is turned on (e.g., at the start of a switching event). In particular, the current Id starts to flow when voltage Vgs (gate-source voltage) exceeds a predetermined threshold voltage, which in the example is 2V exceeded at about −9 ns. The current Id in the example measurement is controlled by a load inductor and prior gate pulse width, which are not shown in FIG. 4, and is about 15 A. Therefore, the current Id goes essentially flat after reaching about 15 A, although as seen in trace 410, current ringing occurs following the current change (which is less ringing than introduced by a conventional coaxial shunt resistor current sensor, for example), which prevents the current Id from being completely flat. In addition, trace 410 shows roll off effect at the onset of the current ramp, which is indicative of low bandwidth. The roll off effect is indicated by the rounded transition at the start of the current ramp.

Trace 420 in FIG. 4 shows voltage Vds (drain-source voltage) of the GaN HEMT, which includes about a 400V voltage drop between 0.00 and about 20 ns. The voltage drop occurs when the GaN HEMT is turned on (e.g., at the start of the switching event), which begins with the current Id beginning rise as shown by trace 410. The change in current Id creates a dip in the voltage Vds of about 28V between about −5.0 ns and about 5 ns before dropping, as shown by trace 420, due to parasitic inductance. Trace 430 shows the voltage Vgs of the GaN HEMT, mentioned above, which is the control signal initiating the switching event. The voltage Vgs is driven from −5V to +5V between about −25 ns and 0.00.

In comparison, the measurement results in FIG. 5 were obtained using a sensor device with low parasitic inductance and high bandwidth, according to a representative embodiment well. Trace 510 shows current Id through the GaN HEMT, which includes a current ramp having an increase of about 15 A between about −10.0 ns and 0.0 occurring when voltage Vgs (gate-source voltage) exceeds a predetermined threshold voltage, as discussed above. Unlike the current ramp of trace 410 in FIG. 4, there is effectively no roll off effect in the trace 510, as seen by the sharp transition at the start of the current ramp, indicating high bandwidth. Trace 510 also shows substantially less ringing occurring following the current change than shown by trace 410, which indicates even lower parasitic inductance than the conventional Pearson probe.

Trace 520 shows voltage Vds of the GaN HEMT, which includes about a 400V voltage drop between 0.00 and about 20 ns. The voltage drop occurs when the GaN HEMT is turned on (e.g., at the start of the switching event). As compared to trace 420, there is only a small dip (e.g., about 5V) in trace 520 prior to the voltage drop, which indicates less parasitic inductance. Trace 530 shows the voltage Vgs of the GaN HEMT, which is the control signal initiating the switching event. The voltage Vgs is driven from −5V to +5V between about −25 ns and 0.00 prior to the switching event. Accordingly, FIG. 5 shows improvement of the representative embodiment over the conventional current sensor in both increased bandwidth and lower parasitic inductance.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A sensor device for measuring current in an electrical circuit of a printed circuit board (PCB), the sensor device comprising:
   a coaxial connector mounted on a tab in the PCB and comprising an inner conductor and a concentric outer conductor, the concentric outer conductor being connected to a ground plane of the PCB through a via connection in the PCB, wherein the tab is formed by a gap through the PCB along a portion of a perimeter surrounding the coaxial connector;
   a sidewall conductor formed on sidewalls of the tab and connected to the ground plane, wherein the sidewalls are defined by the gap through the PCB; and
   a plurality of resistors mounted on the PCB and arranged along the portion of the perimeter surrounding the coaxial connector, each resistor of the plurality of resistors being connected between the inner conductor of the coaxial connector and the ground plane of the PCB through the sidewall conductor,
   wherein current from the electrical circuit flows in a first direction through the ground plane of the PCB creating a first magnetic field, and flows in a second direction between the sidewall conductor and the inner conductor of the coaxial connector through the plurality of resistors creating a second magnetic field, wherein the first magnetic field cancels at least a portion of the second magnetic field.

2. The sensor device of claim 1, further comprising:
   a conductive cover arranged over the plurality of resistors, and connected between the concentric outer conductor of the coaxial connector and the sidewall conductor,
   wherein the current further flows in the first direction between the concentric outer conductor of the coaxial connector and the sidewall conductor creating a third magnetic field, wherein the third magnetic field together with the first magnetic field cancels the portion of the second magnetic field.

3. The sensor device of claim 2, wherein the plurality of resistors comprise chip resistors.

4. The sensor device of claim 3, wherein the portion of the perimeter surrounding the coaxial connector is a portion of a circumference of a circle, along which the plurality of resistors are arranged radially with respect to the coaxial connector.

5. The sensor device of claim 1, wherein the ground plane comprises bottom plating formed on a bottom surface of the tab.

6. The sensor device of claim 5, wherein the sidewall conductor comprises sidewall plating that extends from the bottom plating along the sidewalls of the tab, and
   wherein the plurality of resistors is connected to the ground plane of the PCB through the sidewall plating and the bottom plating.

7. The sensor device of claim 1, wherein each resistor of the plurality of resistors is connected to the inner conductor of the coaxial connector through a connection in the PCB.

8. The sensor device of claim 1, wherein the coaxial connector is connectable to an oscilloscope for performing a double pulse test of the electrical circuit.

9. The sensor device of claim 8, wherein the oscilloscope determines the current from the electrical circuit by measuring a voltage drop over the plurality of resistors.

10. A sensor device for measuring current in an electrical circuit of a printed circuit board (PCB), the sensor device comprising:
- a coaxial connector mounted on a part of the PCB that includes the electrical circuit, the coaxial connector comprising an inner conductor and a concentric outer conductor, the concentric outer conductor being connected to a ground plane of the PCB through a via connection in the PCB;
- a plurality of resistors mounted on the PCB and arranged along a portion of a perimeter surrounding the coaxial connector, each resistor of the plurality of resistors being connected between the inner conductor of the coaxial connector and the ground plane of the PCB; and
- a conductive cover arranged over the plurality of resistors, and connected between the concentric outer conductor of the coaxial connector and the ground plane of the PCB,
- wherein current from the electrical circuit flows in a first direction through the ground plane of the PCB creating a first magnetic field, flows in a second direction through the plurality of resistors creating a second magnetic field, and further flows in the first direction through the conductive cover creating a third magnetic field, wherein the first and third magnetic fields cancel at least a portion of the second magnetic field.

11. The sensor device of claim 10, wherein the part of the PCB on which the coaxial connector is mounted comprises a tab formed by a gap through the PCB along the portion of the perimeter surrounding the coaxial connector, the sensor device further comprising:
- a sidewall conductor formed on sidewalls of the tab defined by the gap through the PCB, the sidewall conductor connecting the plurality of resistors to the ground plane of the PCB.

12. The sensor device of claim 11, wherein the ground plane comprises bottom plating extending across a bottom surface of the tab, and
wherein the sidewall conductor comprises sidewall plating that extends from the bottom plating along the sidewalls of the tab.

13. The sensor device of claim 10, wherein the plurality of resistors comprise chip resistors.

14. The sensor device of claim 13, wherein the portion of the perimeter surrounding the coaxial connector is a portion of a circumference of a circle, along which the plurality of resistors are arranged radially with respect to the coaxial connector.

15. The sensor device of claim 10, wherein each resistor of the plurality of resistors is connected to the inner conductor of the coaxial connector through a connection in the PCB.

16. A sensor device for measuring current in an electrical circuit of a printed circuit board (PCB), the sensor device comprising:
- a coaxial connector mounted on a tab in the PCB and comprising an inner conductor and a concentric outer conductor, wherein the tab is formed by a gap through the PCB along a portion of a perimeter surrounding the coaxial connector;
- bottom plating formed on a bottom surface of the tab and connected to ground;
- sidewall plating formed on sidewalls of the tab and connected to the bottom plating, the sidewalls being defined by the gap through the PCB;
- a plurality of resistors mounted on the tab and arranged along the portion of the perimeter surrounding the coaxial connector, each resistor of the plurality of resistors being connected between the inner conductor of the coaxial connector and the side plating; and
- a conductive cover mounted on the tab and arranged over the plurality of resistors, the conductive cover being connected between the concentric outer conductor of the coaxial connector and the side plating,
- wherein the concentric outer conductor of the coaxial connector is connected to the bottom plating through a via connection in the tab, and
- wherein current from the electrical circuit flows in a first direction from the bottom plating toward the sidewall plating creating a first magnetic field, flows in a second direction from the sidewall plating toward the inner conductor of the coaxial connector through the plurality of resistors creating a second magnetic field, and further flows in the first direction from the concentric outer conductor of the coaxial connector toward the sidewall plating creating a third magnetic field, wherein the first and third magnetic field substantially cancel the second magnetic field.

17. The sensor device of claim 16, wherein the conductive cover covers a top surface of the tab.

18. The sensor device of claim 16, wherein each resistor of the plurality of resistors is connected to the inner conductor of the coaxial connector through a connection within the tab.

19. The sensor device of claim 16, wherein the portion of the perimeter surrounding the coaxial connector is a portion of a circumference of a circle, along which the plurality of resistors are arranged radially with respect to the coaxial connector.

20. The sensor device of claim 19, wherein the plurality of resistors comprise chip resistors.

* * * * *